United States Patent
Loy et al.

(10) Patent No.: US 11,217,747 B2
(45) Date of Patent: Jan. 4, 2022

(54) MEMORY DEVICES AND METHODS OF FORMING MEMORY DEVICES

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/802,562

(22) Filed: Feb. 27, 2020

(65) Prior Publication Data

US 2021/0273160 A1 Sep. 2, 2021

(51) Int. Cl.
*H01L 45/00* (2006.01)
*H01L 27/24* (2006.01)

(52) U.S. Cl.
CPC ...... *H01L 45/1233* (2013.01); *H01L 27/2463* (2013.01); *H01L 45/1253* (2013.01); *H01L 45/146* (2013.01); *H01L 45/1608* (2013.01)

(58) Field of Classification Search
CPC .............. H01L 45/1233; H01L 45/124; H01L 45/1691; H01L 27/2463
See application file for complete search history.

(56) References Cited

U.S. PATENT DOCUMENTS

| | | | |
|---|---|---|---|
| 9,431,604 B2 | 8/2016 | Liao et al. | |
| 9,595,672 B2 * | 3/2017 | Liu | H01L 45/1233 |
| 10,847,720 B1 | 11/2020 | Loy et al. | |
| 2009/0278109 A1 | 11/2009 | Phatak | |

OTHER PUBLICATIONS

Chuang et al., "Effects of Electric Fields on the Switching Properties Improvements of RRAM Device With a Field-Enhanced Elevated-Film-Stack Structure", IEEE Journal of the Electron Devices Society, 2018, pp. 622-626, vol. 6, IEEE.

* cited by examiner

*Primary Examiner* — Mark V Prenty
(74) *Attorney, Agent, or Firm* — Viering Jentschura & Partner mbB

(57) ABSTRACT

A memory device may be provided including one or more bottom electrodes, one or more mask elements, one or more top electrodes and a switching layer. The bottom electrode(s) may include a first bottom electrode, the mask element(s) may include a first mask element and the top electrode(s) may include a first top electrode. The first mask element may be arranged over a first part of the first bottom electrode. The first top electrode may be arranged over and in contact with the first mask element. The switching layer may be arranged to extend over a second part of the first bottom electrode, and along a first side surface of the first mask element and further along a first side surface of the first top electrode. The first side surfaces of the first mask element and the first top electrode may face a same direction.

17 Claims, 11 Drawing Sheets

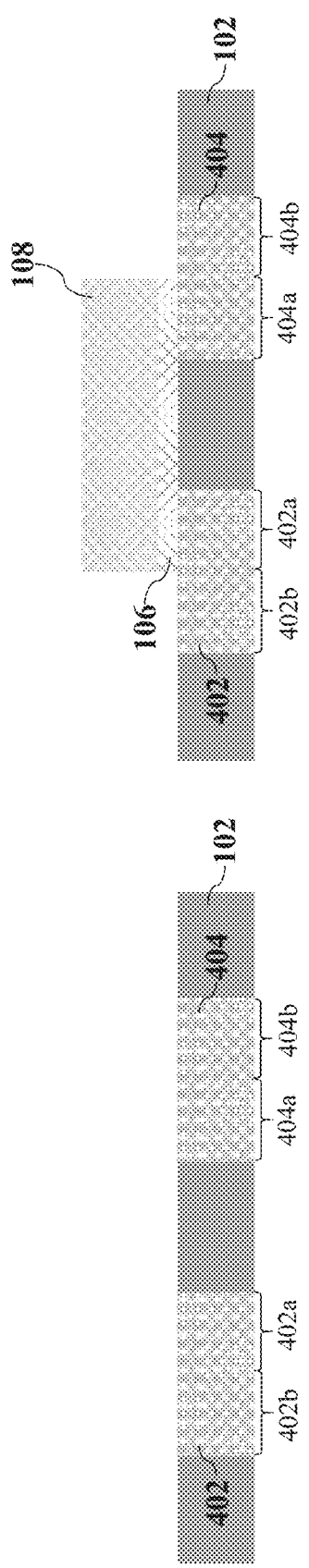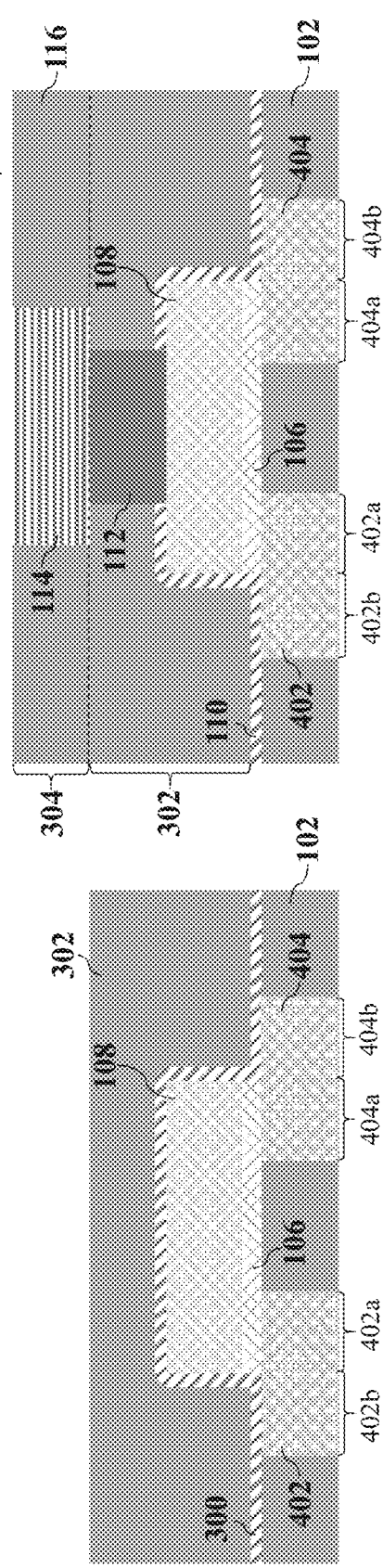

MEMORY DEVICES AND METHODS OF FORMING MEMORY DEVICES

TECHNICAL FIELD

The present disclosure relates generally to memory devices and methods of forming the memory devices.

BACKGROUND

Non-volatile memory devices are often used in consumer electronic products such as smart phones and tablets. One type of non-volatile memory device is the resistive random access memory device (RRAM). A RRAM typically uses a switching layer such as a dielectric layer sandwiched between a top electrode and a bottom electrode. The switching layer is normally insulating. However, upon application of a sufficiently high potential difference between the top and bottom electrodes, a dielectric breakdown event can occur and conducting filaments may be formed within the switching layer between the top and bottom electrodes. The switching layer thus becomes conductive via the conducting filaments. The switching layer can be made insulating again by applying a sufficiently low voltage difference to the top and bottom electrodes to break the conducting filaments. A typical RRAM can switch between states based on the resistance of the switching layer. When the switching layer is insulating, the switching layer has a high resistance, and the RRAM may be referred to as being in a high resistance state (HRS). When the switching layer is conductive, the switching layer has a low resistance and the RRAM may be referred to as being in a low resistance state (LRS). To set the RRAM, the RRAM is switched from the HRS to the LRS. To reset the RRAM, the RRAM is switched from the LRS to the HRS.

Conducting filaments are often formed at random across many locations within the switching layer. Such uncontrolled distribution of the conducting filaments can cause the resistance of the switching layer (and hence, the RRAM) to vary greatly across multiple dielectric breakdown events. For example, the resistance of the switching layer when the RRAM is in the HRS tends to vary greatly over different cycles. This can lead to high device-to-device variability and cycle-to-cycle variability.

Accordingly, it is desirable to provide an improved memory device having reduced variability in its resistance.

SUMMARY

According to various non-limiting embodiments, there is provided a memory device including: a first bottom electrode; a first mask element arranged over a first part of the first bottom electrode; a first top electrode arranged over and in contact with the first mask element; and a switching layer arranged to extend over a second part of the first bottom electrode, and along a first side surface of the first mask element and further along a first side surface of the first top electrode, wherein the first side surfaces of the first mask element and the first top electrode may face a same direction.

According to various non-limiting embodiments, there is provided a memory structure including a plurality of memory devices, wherein at least one of the memory devices may include: a first bottom electrode; a first mask element arranged over a first part of the first bottom electrode; a first top electrode arranged over and in contact with the first mask element; and a switching layer arranged to extend over a second part of the first bottom electrode, and along a first side surface of the first mask element and further along a first side surface of the first top electrode, wherein the first side surfaces of the first mask element and the first top electrode may face a same direction.

According to various non-limiting embodiments, there is provided a method including: forming a first bottom electrode; forming a first mask element over a first part of the first bottom electrode; forming a first top electrode over the first mask element, wherein the first top electrode may be in contact with the first mask element; and forming a switching layer over a second part of the first bottom electrode, and along a first side surface of the first mask element and further along a first side surface of the first top electrode, wherein the first side surfaces of the first mask element and the first top electrode may face a same direction.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which:

FIGS. 5A to 5D show simplified cross-sectional views that illustrate a method for fabricating the memory device of FIG. 4;

DETAILED DESCRIPTION

Figure 1:
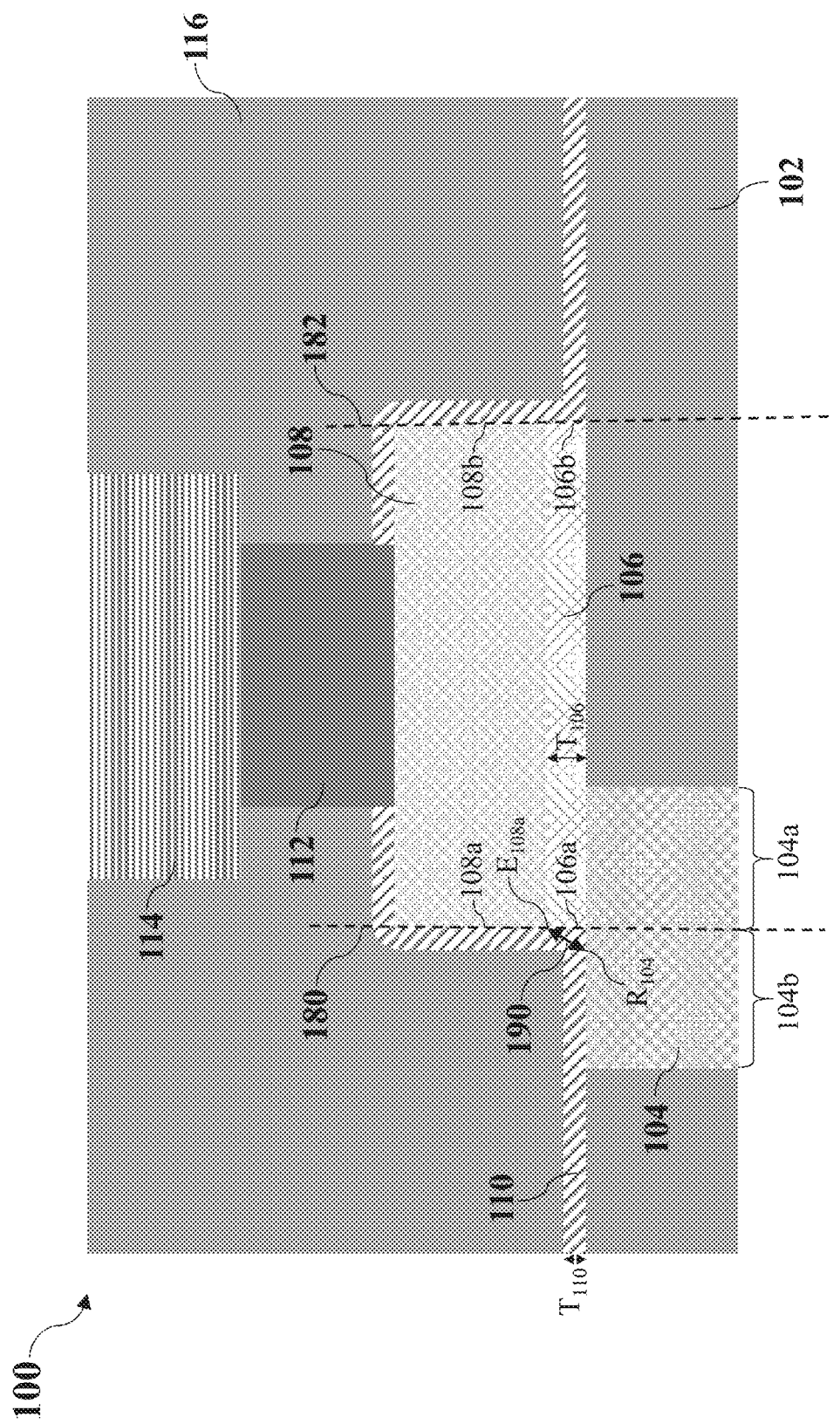
FIG. 1 shows a simplified cross-sectional view of a memory device according to various non-limiting embodiments.

The embodiments generally relate to semiconductor devices. More particularly, some embodiments relate to memory devices, for instance, non-volatile memory devices such as RRAM devices in a non-limiting example. The memory devices may be used in several applications, such as, but not limited to, neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a memory device 100 according to various non-limiting embodiments. The memory device 100 may be a one-bit RRAM device.

As shown in FIG. 1, the memory device 100 may include a base insulating layer 102. The base insulating layer 102 may be an inter-layer dielectric (ILD) layer and may include insulating material, such as, but not limited to, silicon oxide, silicon dioxide, silicon nitride, or combinations thereof.

The memory device 100 may include a first bottom electrode in the form of a single bottom electrode 104, arranged within the base insulating layer 102. The bottom electrode 104 may be referred to as an inert electrode and may include inert electrode material, such as, but not limited to, ruthenium (Ru), platinum (Pt), titanium nitride (TiN), tantalum nitride (TaN), alloys thereof or combinations thereof. A thickness of the bottom electrode 104 may range from about 5 nm to about 10 nm.

The memory device 100 may also include a first mask element in the form of a single mask element 106, arranged over the base insulating layer 102 and a first part 104a of the bottom electrode 104. The mask element 106 may include a first side surface 106a arranged over the bottom electrode 104, and a second side surface 106b opposite to the first side surface 106a. The mask element 106 may be referred to as a hard mask and may include insulating material such as, but not limited to, various oxides and nitrides, for example, silicon oxide ($SiO_x$), tantalum oxide ($TaO_x$), aluminium oxide ($AlO_x$), silicon nitride ($Si_3N_4$), or combinations thereof. A thickness $T_{106}$ of the mask element 106 may be less than 10 nm and in some non-limiting embodiments, may range from about 5 nm to about 10 nm.

In addition, the memory device 100 may include a first top electrode in the form of a single top electrode 108, arranged over and in contact with the mask element 106. The top electrode 108 may also include a first side surface 108a and a second side surface 108b opposite to the first side surface 108a. As shown in FIG. 1, the first side surface 106a of the mask element 106 and the first side surface 108a of the top electrode 108 may face a same direction and may be in vertical alignment with each other. In other words, the first side surface 106a of the mask element 106 and the first side surface 108a of the top electrode 108 may lie on a same vertical plane (first vertical plane 180) substantially perpendicular to the base insulating layer 102. The mask element 106 and the top electrode 108 may have approximately equal lengths and accordingly, the second side surface 106b of the mask element 106 and the second side surface 108b of the top electrode 108 may also be in vertical alignment with each other. In other words, the second side surfaces 106b, 108b of the mask element 106 and the top electrode 108 may lie on a same vertical plane (second vertical plane 182) substantially perpendicular to the base insulating layer 102. The top electrode 108 may be referred to as an active electrode and may include active electrode material such as, but not limited to, tantalum (Ta), hafnium (Hf), titanium (Ti), copper (Cu), silver (Ag), cobalt (Co), tungsten (W), alloys thereof or combinations thereof.

The memory device 100 may also include a switching layer 110. The switching layer 110 may be in the form of a thin liner having a uniform thickness $T_{110}$. The switching layer 110 may be arranged to extend over the base insulating layer 102 and over a second part 104b of the bottom electrode 104. The switching layer 110 may further extend between the bottom electrode 104 and the top electrode 108 along the first side surface 106a of the mask element 106. In particular, the switching layer 110 may extend along the first side surface 106a of the mask element 106 and further along the first side surface 108a of the top electrode 108. In addition, the switching layer 110 may also extend along the second side surface 106b of the mask element 106 and further along the second side surface 108b of the top electrode 108. The switching layer 110 may also extend at least partially over the top electrode 108. The switching layer 110 may include switching material, such as, but not limited to, dielectric material. For example, the switching layer 110 may include magnesium oxide (MgO), tantalum oxide ($TaO_2$), hafnium oxide ($HfO_2$), titanium oxide ($TiO_2$), aluminum oxide ($AlO_2$), silicon dioxide ($SiO_2$) or combinations thereof. A thickness $T_{110}$ of the switching layer 110 may be less than 15 nm and in some non-limiting embodiments, may range from about 5 nm to about 15 nm. In a more specific non-limiting embodiment, the thickness $T_{110}$ of the switching layer 110 may range from about 5 nm to about 10 nm.

As shown in FIG. 1, the memory device 100 may further include a connector 112 arranged through the switching layer 110 to contact the top electrode 108. The connector 112 may be a via and may include conductive material, such as, but not limited to, aluminum, copper, tungsten, alloys thereof, or combinations thereof. The memory device 100 may additionally include a conductive line 114 electrically connected to the connector 112. Accordingly, the conductive line 114 may be electrically connected to the top electrode 108 by the connector 112. The conductive line 114 may serve as a bit line and may similarly include conductive material, such as, but not limited to, aluminum, copper, tungsten, alloys thereof, or combinations thereof.

The memory device 100 may also include a further insulating layer 116 arranged over the base insulating layer 102. As shown in FIG. 1, the mask element 106, top electrode 108, switching layer 110, connector 112 and conductive line 114 may be arranged within the further insulating layer 116. The further insulating layer 116 may be an inter-layer dielectric (ILD) layer and may include insulating material, such as, but not limited to, silicon oxide, silicon dioxide, silicon nitride, or combinations thereof.

As shown in FIG. 1, when a sufficiently large potential difference is applied between the top and bottom electrodes 104, 108 of the memory device 100, conducting filaments 190 may be formed between these electrodes 104, 108. The conducting filaments 190 may be confined within a filament formation region of the switching layer 110 over the second part 104b of the bottom electrode 104 and laterally adjacent to the first side surface 106a of the mask element 106. In some non-limiting embodiments, the conducting filaments 190 may be confined between an edge $E_{108a}$ of the top electrode 108 facing the bottom electrode 104 and a region $R_{104}$ of the second part 104b of the bottom electrode 104.

Figure 2:
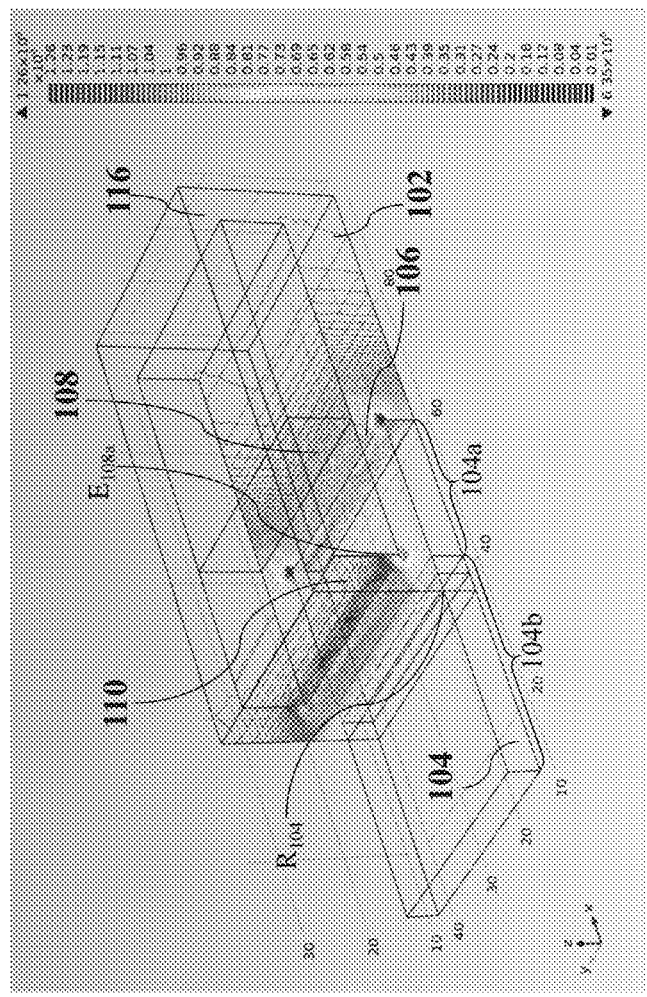
FIG. 2 shows a schematic diagram of a portion of the memory device of FIG. 1 illustrating simulated electric fields formed in the memory device.

FIG. 2 shows simulated electric fields formed in a portion of the memory device 100 when a sufficiently large potential difference is applied between the top and bottom electrodes 104, 108. As shown in FIG. 2, the electric field strengths at the edge $E_{108a}$ of the top electrode 108 and a region $R_{104}$ of the bottom electrode 104 may be higher than the electric field strengths at other parts of the memory device 100. In particular, the simulated electric field strength at the edge $E_{108a}$ of the top electrode 108 is approximately 3.174× $10^8$V/m and the simulated electric field strength at the region $R_{104}$ of the bottom electrode 104 is approximately 2.046× $10^8$V/m. Accordingly, formation of the conducting filaments (e.g. conducting filaments 190 in FIG. 1) may be confined between the edge $E_{108a}$ of the top electrode 108 and the region $R_{104}$ of the bottom electrode 104 where the strengths of the electric fields are the highest. Note that to avoid cluttering the figure, the surfaces 106a, 106b, 108a, 108b and dimensions $T_{106}$, $T_{110}$ are not labelled and the planes 180, 182 are not shown in FIG. 2.

FIGS. 3A to 3D show simplified cross-sectional views that illustrate a method for fabricating the memory device 100 according to various non-limiting embodiments. Similarly, the region $R_{104}$, surfaces 106a, 106b, 108a, 108b, edge $E_{108a}$ and dimensions $T_{106}$, $T_{110}$ are not labelled, and the planes 180, 182 are not shown in FIGS. 3A to 3D to avoid cluttering the figures.

Figure 3B:
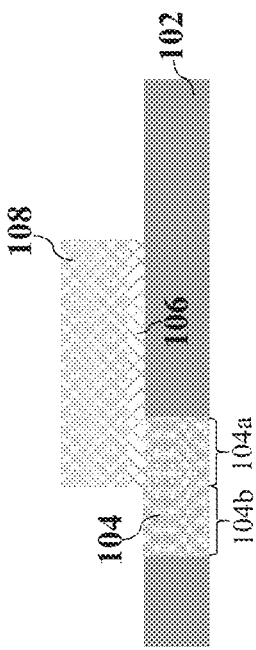
FIGS. 3A to 3D show simplified cross-sectional views that illustrate a method for fabricating the memory device of FIG. 1.
Figure 3D:
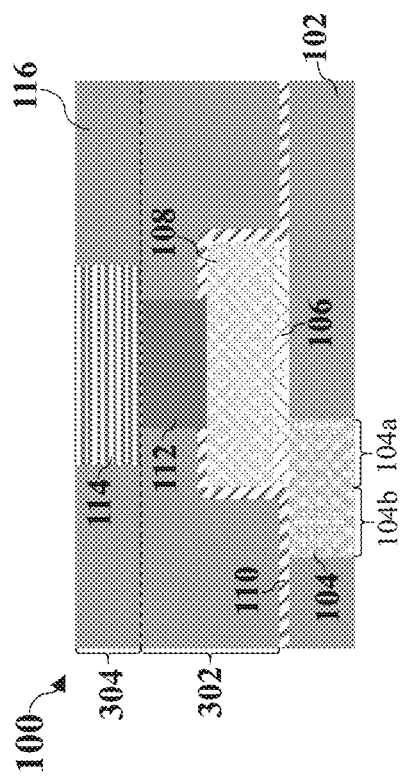
Figure 3A:
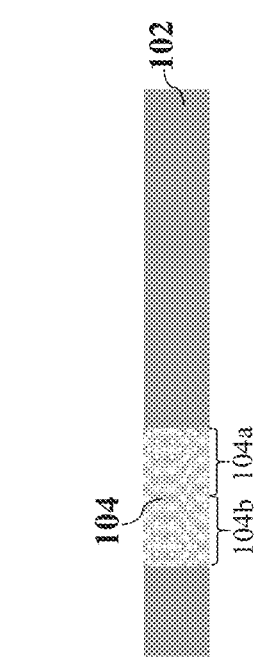

Referring to FIG. 3A, the method may include forming the base insulating layer 102 and forming the bottom electrode 104 within the base insulating layer 102. The bottom electrode 104 may be formed by first depositing inert electrode material over a surface above which the memory device 100 is to be formed, and then selectively etching the inert electrode material using for example, a photoresist mask. The base insulating layer 102 may be formed by depositing insulating material over the bottom electrode 104, and planarizing the insulating material using for example a chemical mechanical planarization (CMP) process.

Referring to FIG. 3B, the method may further include forming the mask element 106 over the base insulating layer 102 and over the first part 104a of the bottom electrode 104, and forming the top electrode 108 over the mask element 106. The mask element 106 and the top electrode 108 may be formed by first depositing mask material to form a mask layer over the base insulating layer 102 and the bottom electrode 104, and then depositing active electrode material to form an electrode layer over the mask layer. The mask layer and the electrode layer may then be etched in a single etching process using for example, a single photoresist mask.

Figure 3C:
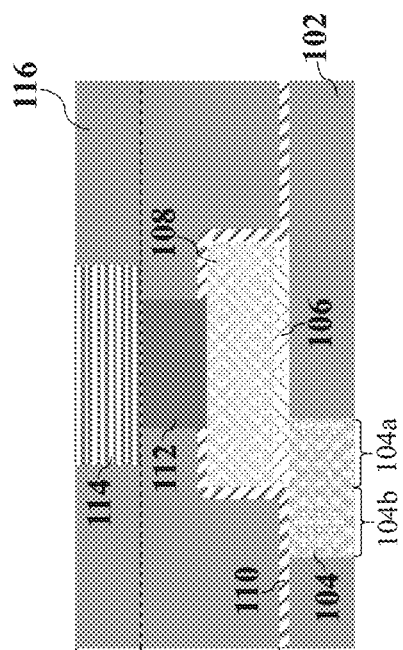

Referring to FIG. 3C, the method may further include depositing a liner 300 of switching material over the base insulating layer 102 and over the top electrode 108. The deposition of the liner 300 may be guided by the mask element 106 and the top electrode 108, and the thickness of the liner 300 may be controllable during the deposition process. Referring to FIG. 3C, the method may further include depositing insulating material over the liner 300 to form a first part 302 of the further insulating layer 116.

Referring to FIG. 3D, the method may further include forming the switching layer 110, the connector 112, the conductive line 114 and a second part 304 of the further insulating layer 116. This may involve a back-end-of-line (BEOL) process. For example, the liner 300 and the first part 302 of the further insulating layer 116 may be etched to form an opening/trench, and conductive material may be deposited into the opening/trench. The remaining portion of the liner 300 may form the switching layer 110; whereas, the conductive material in the opening/trench may form the connector 112. Insulating material may then be deposited over the first part 302 to form a second part 304 of the further insulating layer 116. The second part 304 of the further insulating layer 116 may subsequently be etched to form an opening, and conductive material may be deposited into the opening to form the conductive line 114.

The above described order for the method is only intended to be illustrative, and the method is not limited to the above specifically described order unless otherwise specifically stated.

As described above, the memory device 100 may be fabricated using a CMOS compatible stack process. During the fabrication of the memory device 100, the thicknesses of the switching layer 110 and the mask element 106 may be controllable and the dimensions of the switching layer 110 may not be limited by lithography technology. Accordingly, a thin switching layer 110 and a thin mask element 106 may be achieved. As mentioned above, the conducting filaments 190 may be confined within a filament formation region of the switching layer 110 laterally adjacent to the first side surface 106a of the mask element 106. Therefore, the heights of the conducting filaments 190 may depend on the thickness $T_{106}$ of the mask element 106; whereas, the widths of the conducting filaments 190 may depend on the thickness of the switching layer 110. With a thin switching layer 110 and a thin mask element 106, the conducting filaments 190 may thus be better confined. This may in turn help to reduce the stochasticity of the formation of the conducting filaments 190 and the variability of the resistance of the switching layer 110 and the memory device 100, especially when the memory device 100 is in the HRS. Accordingly, the cycle-to-cycle and device-to-device variability of the memory device 100 may be reduced, and the scalability of the memory device 100 may be improved. The switching voltage of the memory device 100 may also be reduced and the electric field strength in the memory device 100 may be enhanced (since with a thinner mask element 106, the distance through which the conducting filaments 190 extend may be shorter).

As described above, the memory device 100 may include a first bottom electrode in the form of a single bottom electrode 104, a first mask element in the form of a single mask element 106 and a first top electrode in the form of a single top electrode 108. However, in alternative non-limiting embodiments, there may be provided more than one bottom electrodes, more than one mask elements and/or more than one top electrodes. In other words, there may be provided a second bottom electrode, a second mask element and/or a second top electrode.

Figure 4:
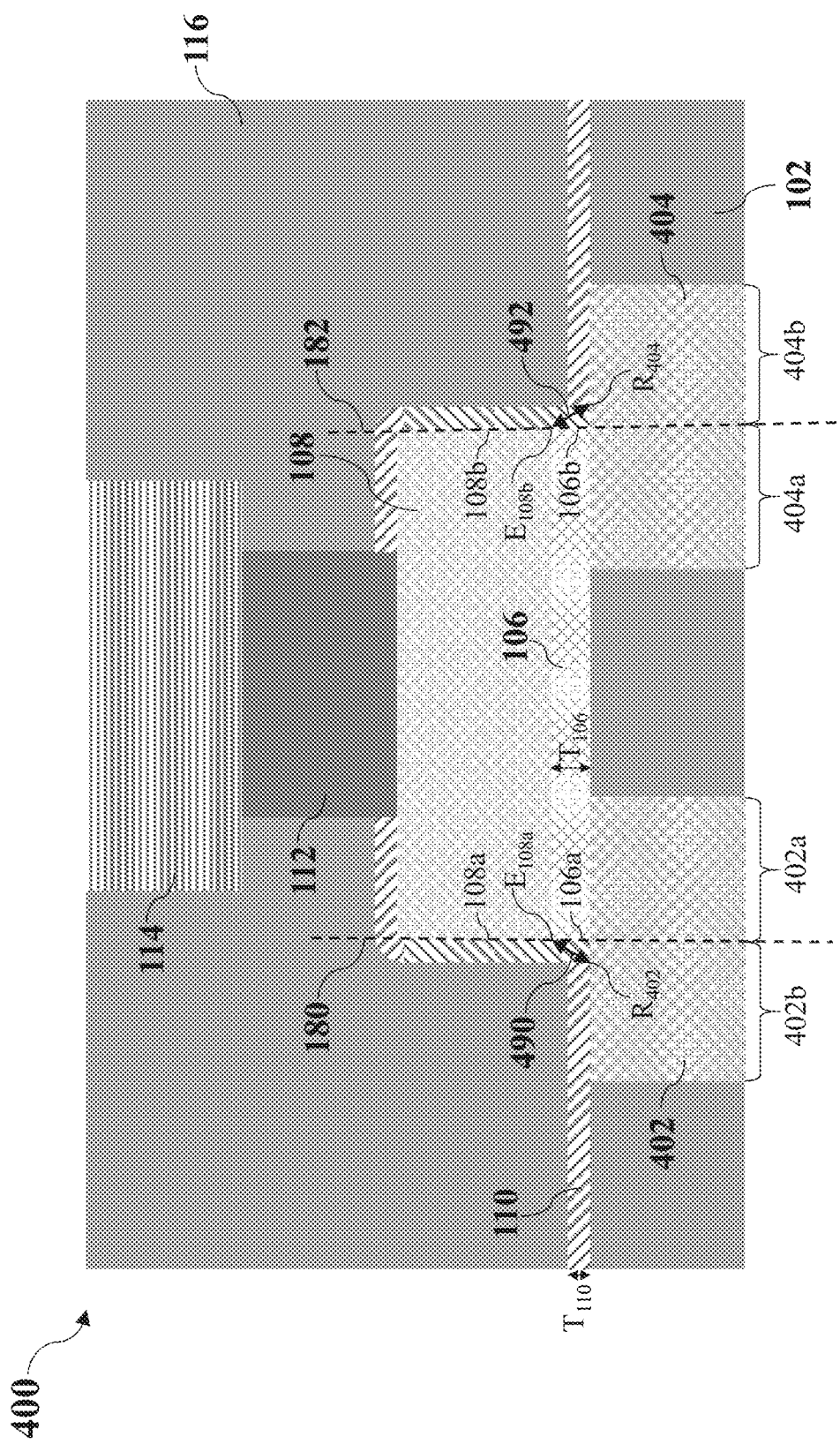
FIG. 4 shows a simplified cross-sectional view of a memory device according to alternative non-limiting embodiments.

FIG. 4 shows a simplified cross-sectional view of a memory device 400 according to alternative non-limiting embodiments. The memory device 400 is similar to the memory device 100, and thus, the common features are labelled with the same reference numerals and need not be discussed. The memory device 400 may be a two-bit RRAM device.

As shown in FIG. 4, instead of a single bottom electrode 104, the memory device 400 may include a plurality of bottom electrodes including a first bottom electrode 402 and a second bottom electrode 404. The mask element 106 may extend over a first part 402a of the first bottom electrode 402 and a first part 404a of the second bottom electrode 404. The switching layer 110 may extend over a second part 402b of the first bottom electrode 402 and a second part 404b of the second bottom electrode 404. Similar to the memory device 100, the switching layer 110 in the memory device 400 may extend along the first and second side surfaces 106a, 106b of the mask element 106, and the first and second side surfaces 108a, 108b of the top electrode 108. In other words, the switching layer 110 in the memory device 400 may extend between the top electrode 108 and the first bottom electrode 402 along the first side surface 106a of the mask element 106, and between the top electrode 108 and the second bottom electrode 404 along the second side surface 106b of the mask element 106.

In the memory device 400, when a sufficiently large potential difference is applied between the top electrode 108 and the first bottom electrode 402, conducting filaments 490 may be formed between the electrodes 108, 402. These conducting filaments 490 may be confined at a filament formation region within the switching layer 110 similar to that described above for the conducting filaments 190 in the memory device 100. In some non-limiting embodiments, the conducting filaments 490 may be confined between an edge $E_{108a}$ of the top electrode 108 facing the first bottom electrode 402 and a region $R_{402}$ of the second part 402b of the first bottom electrode 402. In the memory device 400, conducting filaments 492 may similarly be formed between the top electrode 108 and the second bottom electrode 404 when a sufficiently large potential difference is applied between these electrodes 108, 404. The conducting filaments 492 may be confined at a filament formation region within the switching layer 110 over the second part 404b of the second bottom electrode 404 and laterally adjacent to the second side surface 106b of the mask element 106. In some non-limiting embodiments, the conducting filaments 492 may be confined between an edge $E_{108b}$ of the top electrode 108 facing the second bottom electrode 404 and a region $R_{404}$ of the second part 404b of the second bottom electrode 404.

FIGS. 5A to 5D show simplified cross-sectional views that illustrate a method for fabricating the memory device 400 according to various non-limiting embodiments. Similarly, the regions $R_{402}$, $R_{404}$, surfaces 106a, 106b, 108a, 108b, edges $E_{108a}$, $E_{108b}$ and dimensions $T_{106}$, $T_{110}$ are not labelled, and the planes 180, 182 are not shown in FIGS. 5A to 5D to avoid cluttering the figures.

Referring to FIG. 5A, the method may include forming the base insulating layer 102 and forming the first and second bottom electrodes 402, 404 within the base insulating layer 102. The bottom electrodes 402, 404 may be formed by first depositing inert electrode material over a surface above which the memory device 100 is to be formed, and then selectively etching the inert electrode material using for example, a photoresist mask. The base insulating layer 102 may be formed by depositing insulating material over the bottom electrodes 402, 404 and planarizing the insulating material using for example a chemical mechanical planarization (CMP) process.

Referring to FIGS. 5B to 5D, the method may further include forming the mask element 106, the top electrode 108, the switching layer 110, the connector 112, the conductive line 114, and the further insulating layer 116 in a manner similar to that described above with reference to FIGS. 3B to 3D.

Figure 6:
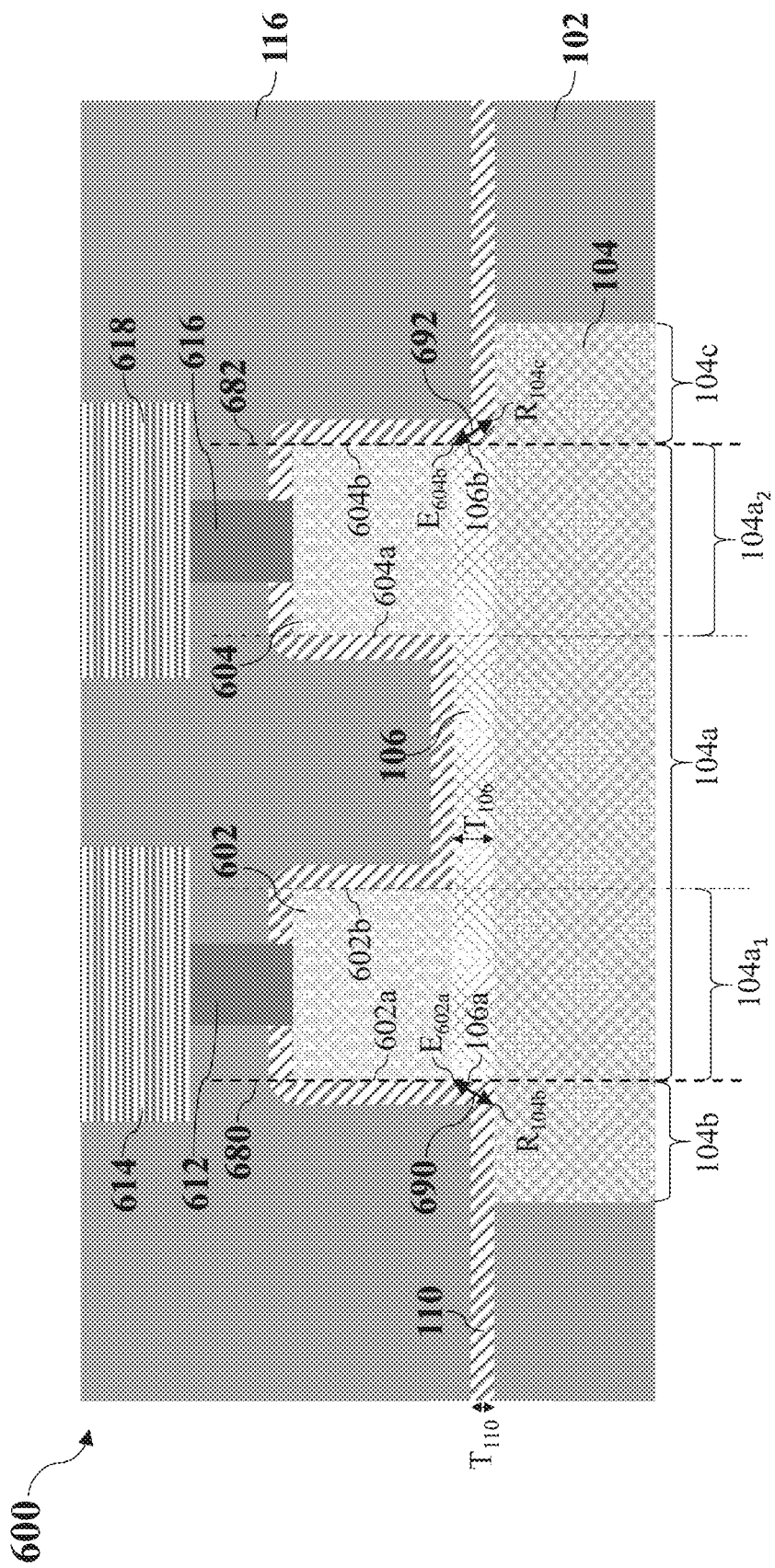
FIG. 6 shows a simplified cross-sectional view of a memory device according to alternative non-limiting embodiments.

FIG. 6 shows a simplified cross-sectional view of a memory device 600 according to alternative non-limiting embodiments. The memory device 600 is similar to the memory device 100, and thus, the common features are labelled with the same reference numerals and need not be discussed. The memory device 600 may be a two-bit RRAM device.

As shown in FIG. 6, instead of a single top electrode 108, the memory device 600 may include a plurality of top electrodes including a first top electrode 602 and a second top electrode 604 arranged over and in contact with the mask element 106. The first and second top electrodes 602, 604 may be spaced apart from each other and a part of the further insulating layer 116 may extend between the first and second top electrodes 602, 604. Accordingly, the first and second top electrodes 602, 604 may be electrically isolated from each other by insulating material arranged between them. Each of the top electrodes 602, 604 may include a first side surface 602a, 604a and a second side surface 602b, 604b opposite to the first side surface 602a, 604a. The first side surface 602a of the first top electrode 602 may face a same direction as, and be in vertical alignment with, the first side surface 106a of the mask element 106. These side surfaces 602a, 106a may both lie on a first vertical plane 680 substantially perpendicular to the base insulating layer 102. The second side surface 604b of the second top electrode 604 may face a same direction as, and be in vertical alignment with, the second side surface 106b of the mask element 106. In particular, the second side surface 604b of the second top electrode 604 and the second side surface 106b of the mask element 106 may lie on a same vertical plane (second vertical plane 682) substantially perpendicular to the base insulating layer 102.

Similar to the memory device 100, the memory device 600 may include a single bottom electrode 104. The mask element 106 may be arranged over a first part 104a of the bottom electrode 104, with the first top electrode 602 extending over a portion $104a_1$ of this first part 104a and the second top electrode 604 extending over another portion $104a_2$ of this first part 104a. The switching layer 110 may extend over the base insulating layer 102, and over a second part 104b and a third part 104c of the bottom electrode 104. The switching layer 110 may also extend along the first and second side surfaces 106a, 106b, 602a, 602b, 604a, 604b of the mask element 106 and the top electrodes 602, 604. Accordingly, the switching layer 110 may extend between the first top electrode 602 and the bottom electrode 104 along the first side surface 106a of the mask element 106, and between the second top electrode 604 and the bottom electrode 104 along the second side surface 106b of the mask element 106. Further, the switching layer 110 may extend at least partially over each of the first and second top electrodes 602, 604.

The memory device 600 may also include a first connector 612 and a second connector 616 arranged through the switching layer 110 to contact the first and second top electrodes 602, 604 respectively. A first conductive line 614 and a second conductive line 618 may be arranged over the first connector 612 and the second connector 616 respectively for electrical connection to the first and second top electrodes 602, 604 respectively. The conductive lines 614, 618 may serve as bit lines.

As shown in FIG. 6, when a sufficiently large potential difference is applied between the bottom electrode 104 and the first top electrode 602, conducting filaments 690 may be formed between these electrodes 104, 602. The conducting filaments 690 may be confined at a filament formation region within the switching layer 110 over the second part 104b of the bottom electrode 104 and laterally adjacent to the first side surface 106a of the mask element 106. In some non-limiting embodiments, the conducting filaments 690 may be confined between an edge $E_{602a}$ of the first top electrode 602 facing the bottom electrode 104 and a region $R_{104b}$ of the second part 104b of the bottom electrode 104. When a sufficiently large potential difference is applied between the bottom electrode 104 and the second top electrode 604, conducting filaments 692 may also be formed between these electrodes 104, 604. These conducting filaments 692 may be confined at a filament formation region within the switching layer 110 over the third part 104c of the bottom electrode 104 and laterally adjacent to the second side surface 106b of the mask element 106. In some non-limiting embodiments, the conducting filaments 692 may be confined between an edge $E_{604b}$ of the second top electrode 604 facing the bottom electrode 104 and a region $R_{104c}$ of the third part 104c of the bottom electrode 104.

Figure 7:
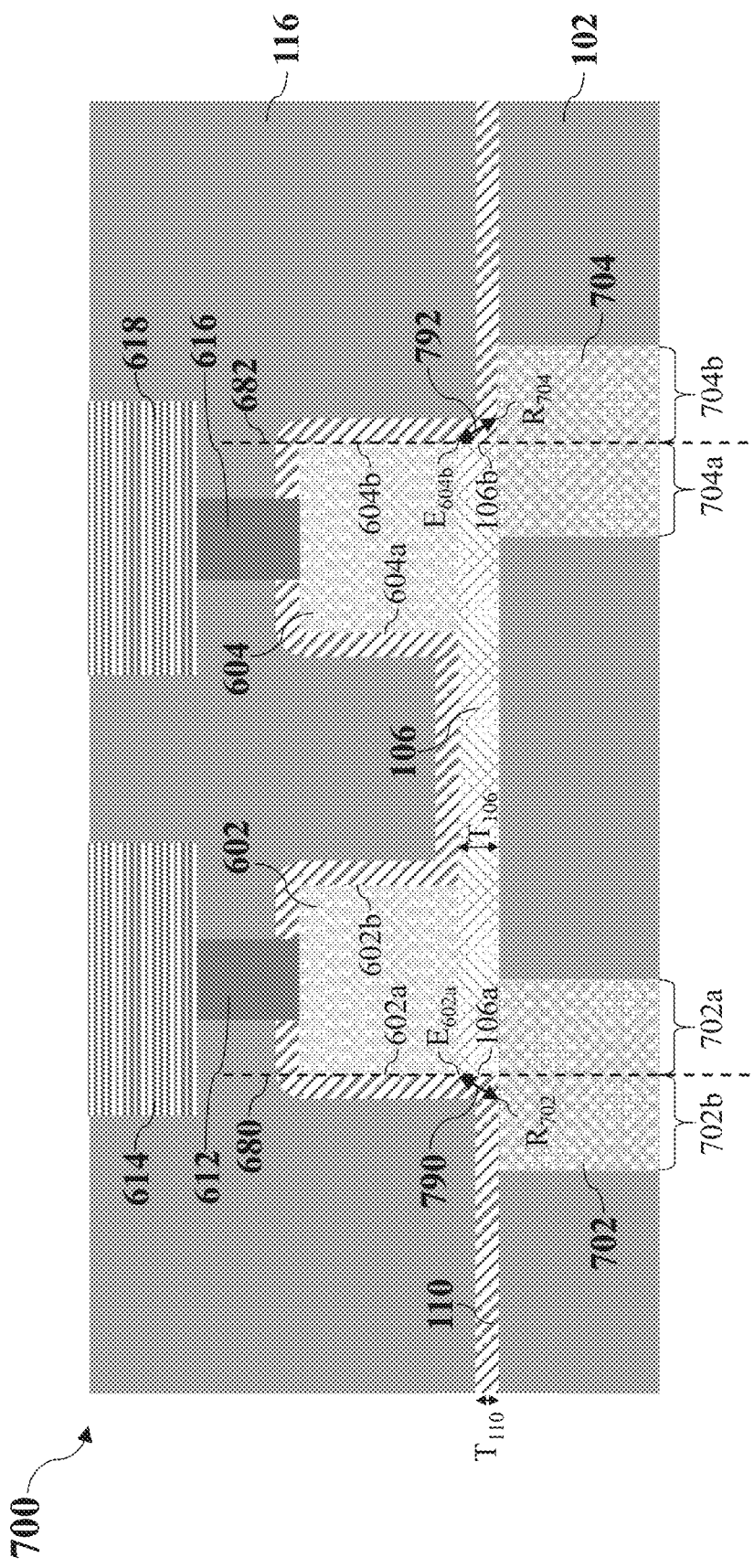
FIG. 7 shows a simplified cross-sectional view of a memory device according to alternative non-limiting embodiments.

FIG. 7 shows a simplified cross-sectional view of a memory device 700 according to alternative non-limiting embodiments. The memory device 700 is similar to the memory device 600, and thus, the common features are labelled with the same reference numerals and need not be discussed. The memory device 700 may be a two-bit RRAM device.

As compared to the memory device 600, instead of a single bottom electrode 104, the memory device 700 may include a plurality of bottom electrodes including a first bottom electrode 702 and a second bottom electrode 704. The mask element 106 may be arranged over a first part 702a of the first bottom electrode 702 and a first part 704a of the second bottom electrode 704; whereas, the switching layer 110 may be arranged over a second part 702b of the first bottom electrode 702 and a second part 704b of the second bottom electrode 704. Similar to the memory device 600, the switching layer 110 may extend along the first side surface 106a of the mask element 106 and the first side surface 602a of the first top electrode 602, and along the second side surface 106b of the mask element 106 and the second side surface 604b of the second top electrode 604. Accordingly, the switching layer 110 may extend between the first top electrode 602 and the first bottom electrode 702 along the first side surface 106a of the mask element 106, and between the second top electrode 604 and the second bottom electrode 704 along the second side surface 106b of the mask element 106.

As shown in FIG. 7, when a sufficiently large potential difference is applied between the first top electrode 602 and the first bottom electrode 702, conducting filaments 790 may be formed between these electrodes 602, 702. These conducting filaments 790 may be confined within a filament formation region of the switching layer 110 over the second part 702b of the first bottom electrode 702 and laterally adjacent to the first side surface 106a of the mask element 106. In some non-limiting embodiments, the conducting filaments 790 may be confined between an edge $E_{602a}$ of the first top electrode 602 facing the first bottom electrode 702 and a region $R_{702}$ of the second part 702b of the first bottom electrode 702. Similarly, when a sufficiently large potential difference is applied between the second top electrode 604 and the second bottom electrode 704, conducting filaments 792 may be formed between these electrodes 604, 704. These conducting filaments 792 may be confined within a filament formation region of the switching layer 110 over the second part 704b of the second bottom electrode 704 and laterally adjacent to the second side surface 106b of the mask element 106. In some non-limiting embodiments, the conducting filaments 792 may be confined between an edge $E_{604b}$ of the second top electrode 604 facing the second bottom electrode 704 and a region $R_{704}$ of the second part 704b of the second bottom electrode 704.

Figure 8:
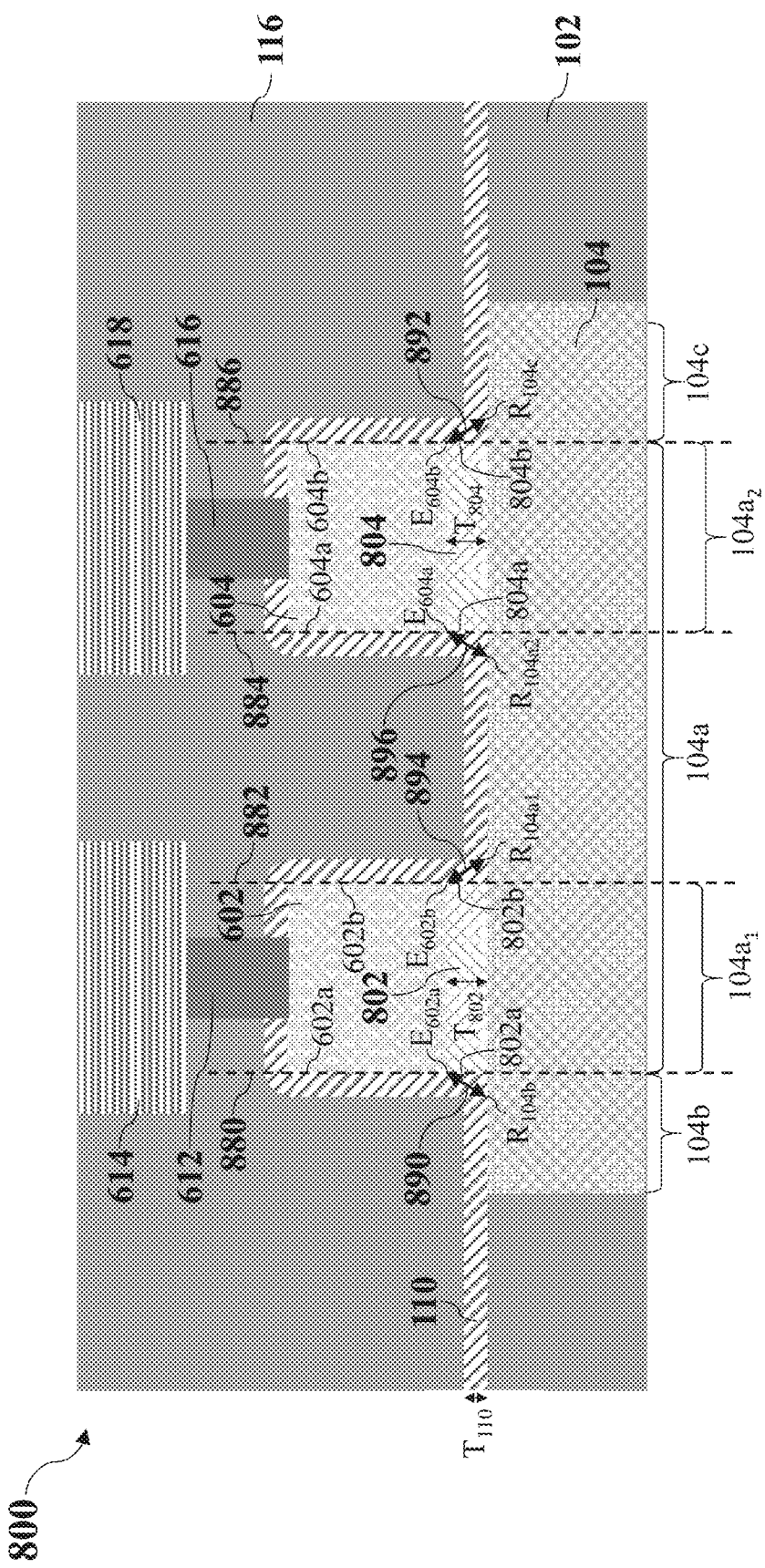
FIG. 8 shows a simplified cross-sectional view of a memory device according to alternative non-limiting embodiments.

FIG. 8 shows a simplified cross-sectional view of a memory device 800 according to alternative non-limiting embodiments. The memory device 800 is similar to the memory device 600, and thus, the common features are labelled with the same reference numerals and need not be discussed. The memory device 800 may be a two-bit RRAM device.

As compared to the memory device 600, instead of a single mask element 106, the memory device 800 may include a plurality of mask elements including a first mask element 802 and a second mask element 804. The first and second mask elements 802, 804 may be similar to the mask element 106 of the memory device 100, and may each have a thickness $T_{802}$, $T_{804}$ approximately equal to the thickness $T_{106}$ of the mask element 106. The first top electrode 602 may be arranged over the first mask element 802 and the second top electrode 604 may be arranged over the second mask element 804. As shown in FIG. 8, each of the first and second mask elements 802, 804 may include a first side surface 802a, 804a and a second side surface 802b, 804b opposite to the first side surface 802a, 804a. The first side surface 602a of the first top electrode 602 and the first side surface 802a of the first mask element 802 may face a same direction and be in vertical alignment along a first vertical plane 880; and the second side surface 602b of the first top electrode 602 and the second side surface 802b of the first mask element 802 may be in vertical alignment along a second vertical plane 882. Similarly, the first side surface 604a of the second top electrode 604 and the first side surface 804a of the second mask element 804 may face a same direction and be in vertical alignment along a third vertical plane 884; and the second side surface 604b of the second top electrode 604 and the second side surface 804b of the second mask element 804 may be in vertical alignment along a fourth vertical plane 886. The vertical planes 880, 882, 884, 886 may be substantially perpendicular to the base insulating layer 102.

As shown in FIG. 8, the first mask element 802 and the second mask element 804 may extend over the first part 104a of the bottom electrode 104, with the first mask element 802 extending over the portion $104a_1$ and the second mask element 804 extending over the portion $104a_2$. Similar to the memory device 600, the switching layer 110 may extend over the base insulating layer 102, and the second and third parts 104b, 104c of the bottom electrode 104. In the memory device 800, the first and second mask elements 802, 804 may be spaced apart from each other and the switching layer 110 may further extend between the first and second mask elements 802, 804, over the bottom electrode 104. The switching layer 110 may also extend along the first and second side surfaces 602a, 602b, 604a, 604b, 802a, 802b, 804a, 804b of the top electrodes 602, 604 and the mask elements 802, 804. Accordingly, the switching layer 110 may extend between the first top electrode 602 and the bottom electrode 104 along both the first and second side surfaces 802a, 802b of the first mask element 802, and between the second top electrode 604 and the bottom electrode 104 along both the first and second side surfaces 804a, 804b of the second mask element 804.

As shown in FIG. 8, when a sufficiently large potential difference is applied between the first top electrode 602 and the bottom electrode 104, conducting filaments 890, 894 may be formed between the electrodes 602, 104. Similarly, when a sufficiently large potential difference is applied between the second top electrode 604 and the bottom electrode 104, conducting filaments 892, 896 may be formed between the electrodes 604, 104. The conducting filaments 890, 892 may be confined at respective filament formation regions similar to those described above for the conducting filaments 690, 692 of the memory device 600. Further, the conducting filaments 894, 896 may be confined at filament formation regions within the switching layer 110 over the first part 104a of the bottom electrode 104, with the filament formation region of the conducting filaments 894 laterally adjacent and nearer to the second side surface 802b of the first mask element 802 and the filament formation region of the conducting filaments 896 laterally adjacent and nearer to the first side surface 804a of the second mask element 804. In some non-limiting embodiments, the conducting filaments 894 may be confined between an edge $E_{602b}$ of the first top electrode 602 facing the bottom electrode 104 and a region $R_{104a1}$ of the first part 104a of the bottom electrode 104. In some non-limiting embodiments, the conducting filaments 896 may be confined between an edge $E_{604a}$ of the second top electrode 604 facing the bottom electrode 104 and a region $R_{104a2}$ of the first part 104a of the bottom electrode 104.

Figure 9:
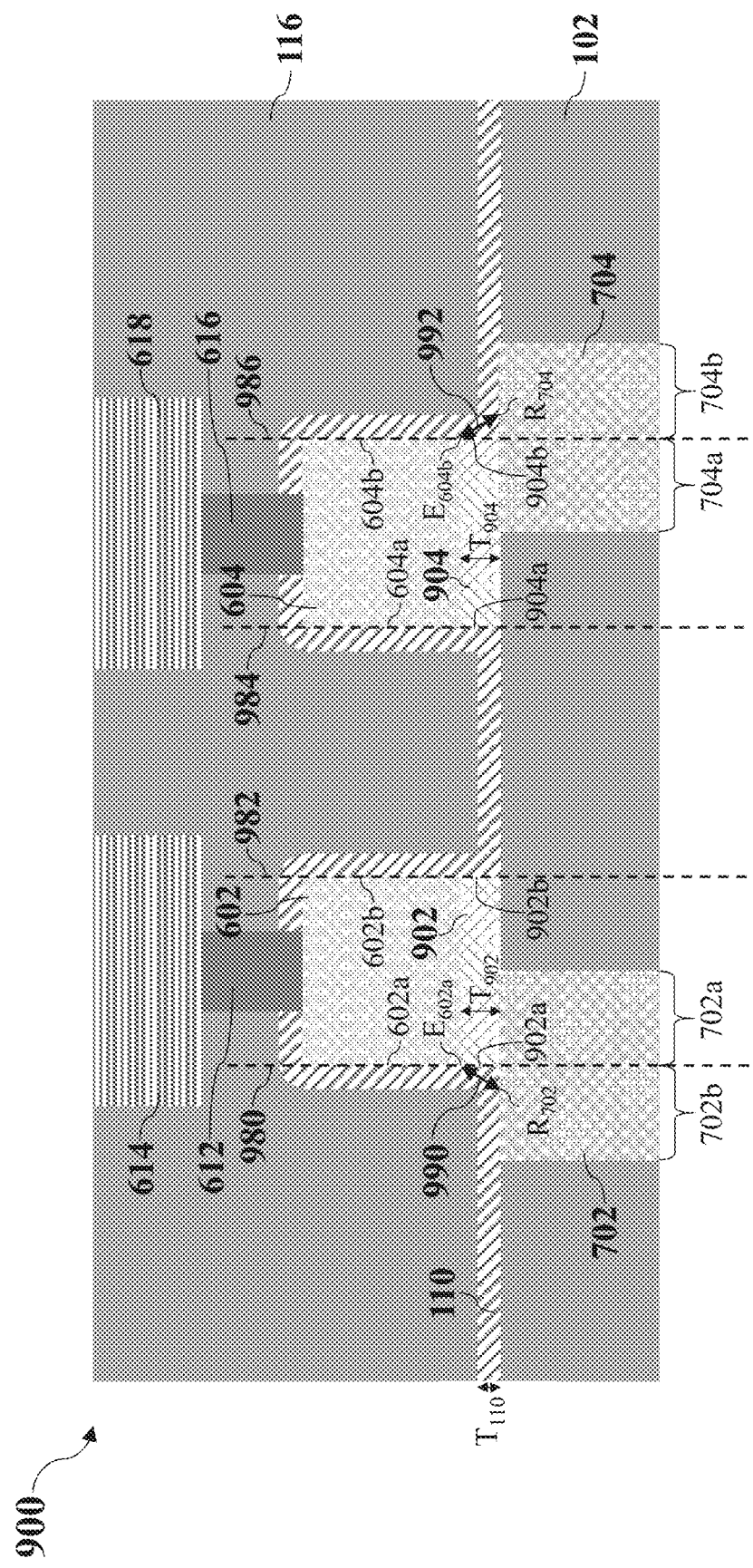
FIG. 9 shows a simplified cross-sectional view of a memory device according to alternative non-limiting embodiments.

FIG. 9 shows a simplified cross-sectional view of a memory device 900 according to alternative non-limiting embodiments. The memory device 900 is similar to the memory device 700, and thus, the common features are labelled with the same reference numerals and need not be discussed. The memory device 900 may be a two-bit RRAM device.

As compared to the memory device 700, instead of a single mask element 106, the memory device 900 may include a plurality of mask elements including a first mask element 902 and a second mask element 904. The first and second mask elements 902, 904 may be similar to the mask element 106 of the memory device 100, and may each have a thickness $T_{902}$, $T_{904}$ approximately equal to the thickness $T_{106}$ of the mask element 106. The first mask element 902 and the second mask element 904 may be arranged over at least a part of the first bottom electrode 702 and at least a part of the second bottom electrode 704 respectively. In particular, the first mask element 902 may be arranged over a first part 702a of the first bottom electrode 702 and the second mask element 904 may be arranged over a first part 704a of the second bottom electrode 704. The arrangement of each top electrode 602, 604 relative to the mask element 902, 904 under it may be similar to that in the memory device 800 as described above. In particular, each of the first and second mask elements 902, 904 may include a first side surface 902a, 904a and a second side surface 902b, 904b, and these side surfaces 902a, 904a, 902b, 904b may be in vertical alignment with respective side surfaces 602a, 602b, 604a, 604b of the top electrodes 602, 604 along respective vertical planes 980, 982, 984, 986 substantially perpendicular to the base insulating layer 102.

In the memory device 900, the switching layer 110 may extend over the base insulating layer 102 and the second parts 702b, 704b of the first and second bottom electrodes 702, 704 in a manner similar to that in the memory device 700. Further, the first and second mask elements 902, 904 may be spaced apart from each other and the switching layer 110 may further extend between the first and second mask elements 902, 904 over the base insulating layer 102. The switching layer 110 in the memory device 900 may be arranged relative to the top electrodes 602, 604 and the mask elements 902, 904 in a manner similar to that in the memory device 800. Accordingly, the switching layer 110 may extend between the first bottom electrode 702 and the first top electrode 602 along the first side surface 902a of the first mask element 902, and between the second bottom electrode 704 and the second top electrode 604 along the second side surface 904b of the second mask element 904.

As shown in FIG. 9, when a sufficiently large potential difference is applied between the first top electrode 602 and the first bottom electrode 702, conducting filaments 990 may be formed between these electrodes 602, 702. Similarly, when a sufficiently large potential difference is applied between the second top electrode 604 and the second bottom electrode 704, conducting filaments 992 may be formed between these electrodes 604, 704. The conducting filaments 990 may be confined within a filament formation region of the switching layer 110 over the second part 702b of the first bottom electrode 702 and laterally adjacent to the first side surface 902a of the first mask element 902; whereas, the conducting filaments 992 may be confined within a filament formation region of the switching layer 110 over the second part 704b of the second bottom electrode 704 and laterally adjacent to the second side surface 904b of the second mask element 904. In some non-limiting embodiments, the conducting filaments 990 may be confined between an edge $E_{602a}$ of the first top electrode 602 and a region $R_{702}$ of the second part 702b of the first bottom electrode 702. In some non-limiting embodiments, the conducting filaments 992 may be confined between an edge $E_{604b}$ of the second top electrode 604 and a region $R_{704}$ of the second part 704b of the second bottom electrode 704.

As compared to the memory devices 600, 700, the fabrication processes of the memory devices 800, 900 may be simpler. In particular, while two separate etching processes may be used to form the mask element 106 and the top electrodes 602, 604 of the memory devices 600, 700 (with the mask element 106 formed before forming the top electrodes 602, 604), the first and second mask elements 802, 804, 902, 904 of the memory devices 800, 900 may be fabricated together with the first and second top electrodes 602, 604 using a single etching process. Therefore, the number of etching processes/lithography processes for forming the memory devices 800, 900 may be less than that for forming the memory devices 600, 700.

Figure 10:
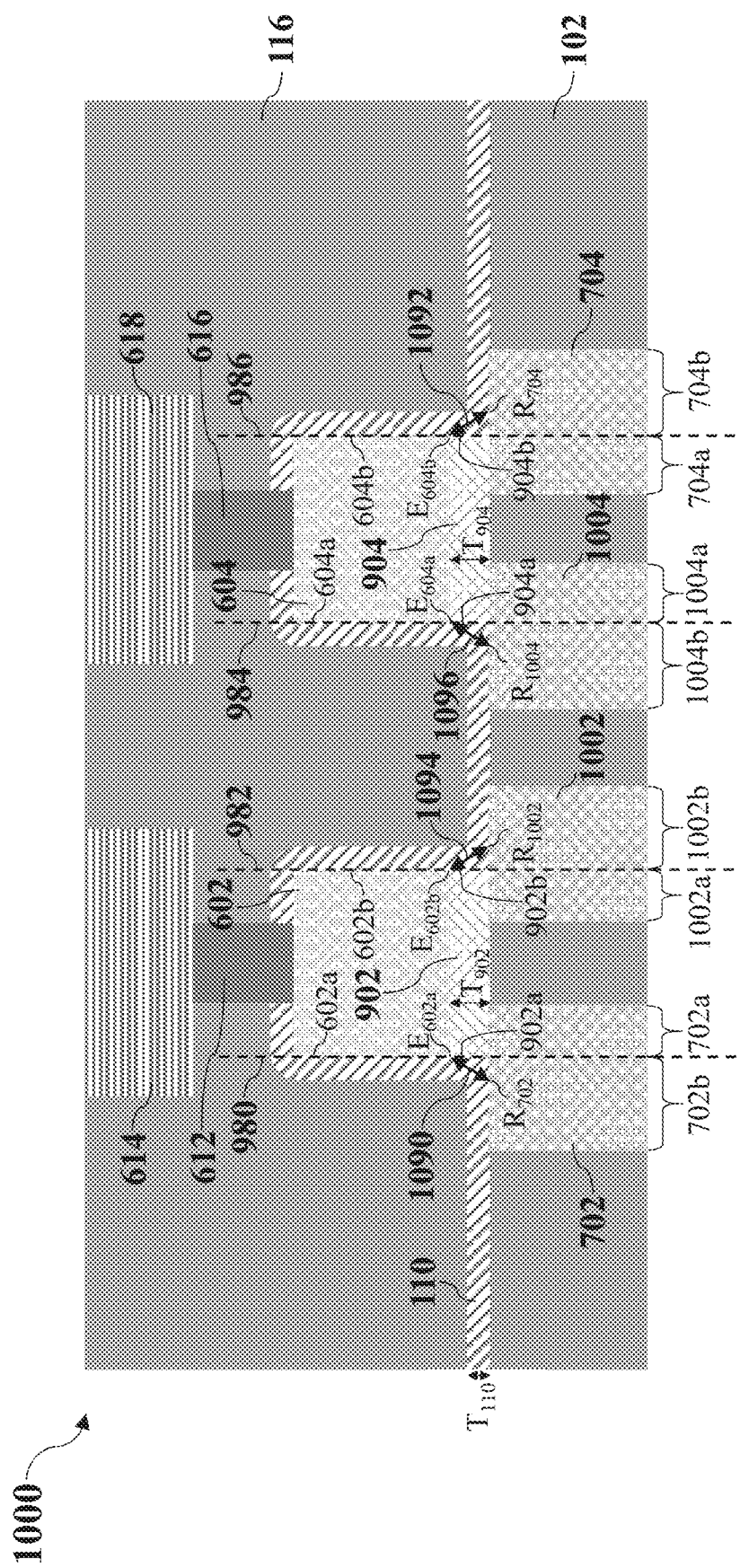
FIG. 10 shows a simplified cross-sectional view of a memory device according to alternative non-limiting embodiments.

FIG. 10 shows a simplified cross-sectional view of a memory device 1000 according to alternative non-limiting embodiments. The memory device 1000 is similar to the memory device 900, and thus, the common features are labelled with the same reference numerals and need not be discussed. The memory device 1000 may be a four-bit RRAM device.

As compared to the memory device 900, the memory device 1000 may further include a third bottom electrode 1002 and a fourth bottom electrode 1004. The first top electrode 602 and the first mask element 902 may be arranged over a first part 1002a of the third bottom electrode 1002; whereas, the second top electrode 604 and the second mask element 904 may be arranged over a first part 1004a of the fourth bottom electrode 1004.

As shown in FIG. 10, the switching layer 110 may extend between the first mask element 902 and the second mask element 904 over the third bottom electrode 1002 and the fourth bottom electrode 1004, in particular, over the second parts 1002b, 1004b of the third and fourth bottom electrodes 1002, 1004. The switching layer 110 may also extend along the side surfaces 602a, 902a, 602b, 902b, 604a, 904a, 604b, 904b of the top electrodes 602, 604 and the mask elements 902, 904 in a manner similar to that in the memory device 900 as described above. Accordingly, the switching layer 110 may extend between the first top electrode 602 and the first bottom electrode 702, and between the second top electrode 604 and the second bottom electrode 704 in a manner similar to that in the memory device 900. The switching layer 110 may also extend between the first top electrode 602 and the third bottom electrode 1002 along the second side surface 902b of the first mask element 902, and between the second top electrode 604 and the fourth bottom electrode 1004 along the first side surface 904a of the second mask element 904.

As shown in FIG. 10, when a sufficiently large potential difference is applied between the first top electrode 602 and the first bottom electrode 702, or between the second top electrode 604 and the second bottom electrode 704, conducting filaments 1090, 1092 may be formed. These conducting filaments 1090, 1092 may be confined at filament formation regions similar to those for the conducting filaments 990, 992 in the memory device 900 as described above. In the memory device 1000, when a sufficiently large potential difference is applied between the first top electrode 602 and the third bottom electrode 1002, conducting filaments 1094 may be formed between these electrodes 602, 1002. These conducting filaments 1094 may be confined at a filament formation region within the switching layer 110 over the second part 1002b of the third bottom electrode 1002 and laterally adjacent to the second side surface 902b of the first mask element 902. In some non-limiting embodiments, the conducting filaments 1094 may be confined between an edge $E_{602b}$ of the first top electrode 602 facing the third bottom electrode 1002 and a region $R_{1002}$ of the second part 1002b of the third bottom electrode 1002. Similarly, when a sufficiently large potential difference is applied between the second top electrode 604 and the fourth bottom electrode 1004, conducting filaments 1096 may be formed between these electrodes 604, 1004. These conducting filaments 1096 may be confined at a filament formation region within the switching layer 110 over the second part 1004b of the fourth bottom electrode 1004 and laterally adjacent to the first side surface 904a of the second mask element 904. In some non-limiting embodiments, the conducting filaments 1096 may be confined between an edge $E_{604a}$ of the second top electrode 604 facing the fourth bottom electrode 1004 and a region $R_{1004}$ of the second part 1004b of the fourth bottom electrode 1004.

A semiconductor structure including the memory device 800 may further include a transistor electrically connected to the bottom electrode 104; whereas, a semiconductor structure including the memory device 1000 may further include four transistors electrically connected to respective ones of the bottom electrodes 702, 704, 1002, 1004. Accordingly, while the memory device 1000 may be capable of storing more bits than the memory device 800, the semiconductor structure including the memory device 800 may be more compact than the semiconductor structure including the memory device 1000.

In alternative non-limiting embodiments, instead of the third and fourth bottom electrodes 1002, 1004, the memory device 1000 may include a single bottom electrode between the first and second bottom electrodes 702, 704 within the base insulating layer 102. Each of the top electrodes 602, 604 may be arranged over a part of the single bottom electrode and when a sufficiently large potential difference is applied between one of the top electrodes 602, 604 and the single bottom electrode, conducting filaments similar to the conducting filaments 1094, 1096 as described above may be formed between the top electrode 602/604 and the single bottom electrode.

The memory devices 400, 600, 700, 800, 900, 1000 may be fabricated in a manner similar to the memory device 100. Accordingly, the conducting filaments 490, 492, 690, 692, 790, 792, 890-896, 990, 992, 1090-1096 in these memory devices 400, 600, 700, 800, 900, 1000 may also be better confined.

Figure 11:
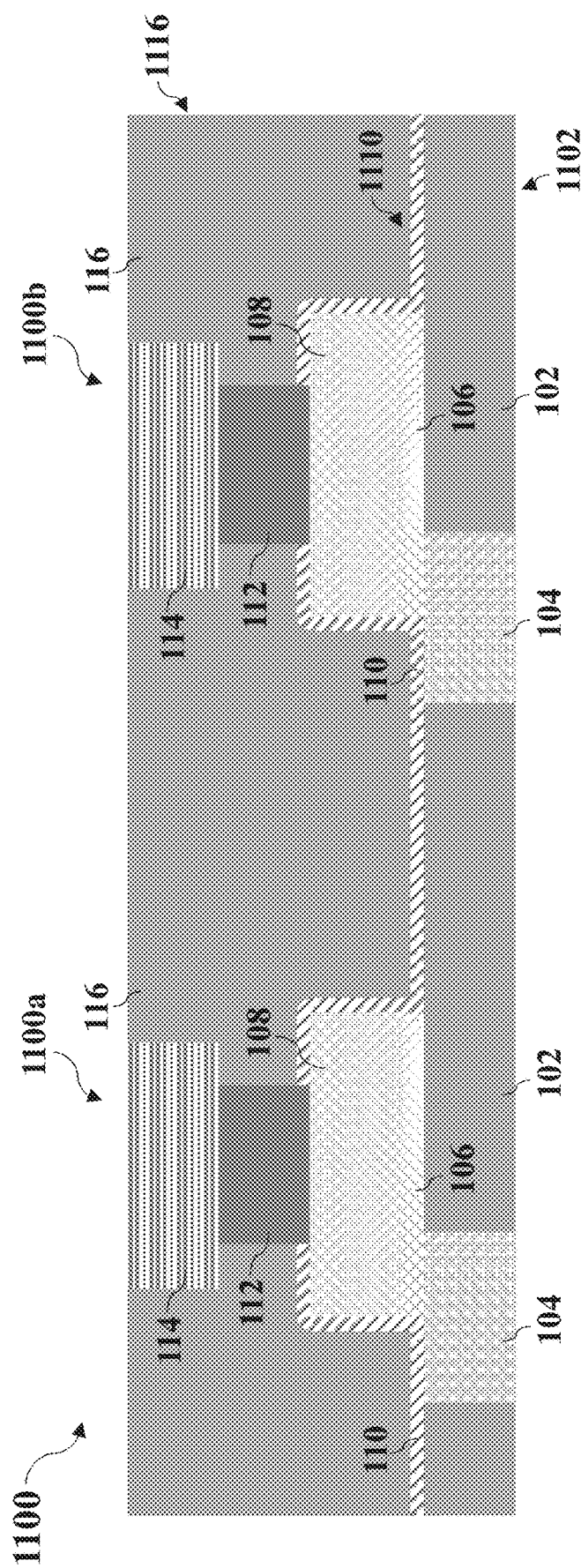
FIG. 11 shows a simplified cross-sectional view of a memory structure according to various non-limiting embodiments.

FIG. 11 shows a memory structure 1100 according to various non-limiting embodiments. The memory structure 1100 may include a plurality of memory devices including a first memory device 1100a and a second memory device 1100b. The memory devices 1100a, 1100b may be similar to the memory device 100 shown in FIG. 1. Referring to FIG. 11, the base insulating layers 102 of the memory devices 1100a, 1100b may be formed as an integrated base insulating layer 1102 with the bottom electrodes 104 arranged within it. Further, the switching layers 110 of the memory devices 1100a, 1100b may be formed as an integrated switching layer 1110 that may extend continuously between the mask elements 106 of the memory devices 1100a, 1100b. Similarly, the further insulating layers 116 of the memory devices 1100a, 1100b may be formed as an integrated insulating layer 1116. Note that for simplicity, in FIG. 11, the parts 104a, 104b, region $R_{104}$, edge $E_{108a}$, surfaces 106a, 106b, 108a, 108b and dimensions $T_{106}$, $T_{110}$ are not labelled, and the planes 180, 182 are not shown.

In alternative non-limiting embodiments, one or both of the memory devices 1100a, 1100b may instead be similar to other types of memory devices, such as the memory devices 400, 600, 700, 800, 900, 1000 as described above. Further, although only two memory devices 1100a, 1100b are depicted in FIG. 11, it is understood that the memory structure 1100 may include more than two memory devices, where each of the memory devices may be similar to one of the memory devices 100, 400, 600, 700, 800, 900, 1000 as described above. The memory devices in the memory structure 1100 may be of different types. In addition, the memory structure 1100 may be in any configuration such as, but not limited to, a one-transistor-one-resistor (1T1R) cross-bar configuration, a one-selector-one-resistor (1S1R) configuration, or a one-selector-n-resistors (1SnR) configuration.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
   a first bottom electrode;
   a first mask element arranged over a first part of the first bottom electrode;
   a first top electrode arranged over and in contact with the first mask element; and
   a switching layer arranged to extend over a second part of the first bottom electrode, and along a first side surface of the first mask element and further along a first side surface of the first top electrode, wherein the first side surfaces of the first mask element and the first top electrode face a same direction,
   wherein the memory device further comprises a second bottom electrode, and wherein the switching layer extends between the first top electrode and the second bottom electrode along a second side surface opposite to the first side surface of the first mask element, or
   wherein the memory device further comprises a second top electrode arranged over and in contact with the first mask element, and wherein the switching layer extends between the second top electrode and the first bottom electrode along a second side surface opposite to the first side surface of the first mask element.

2. The memory device of claim 1 wherein when the memory device comprises the second bottom electrode, the memory device further comprises a second top electrode, and wherein the switching layer extends between the second top electrode and the second bottom electrode along a second side surface opposite to the first side surface of the first mask element.

3. A memory device comprising:
   a first bottom electrode;
   a first mask element arranged over a first part of the first bottom electrode;
   a first top electrode arranged over and in contact with the first mask element; and
   a switching layer arranged to extend over a second part of the first bottom electrode, and along a first side surface of the first mask element and further along a first side surface of the first top electrode, wherein the first side surfaces of the first mask element and the first top electrode face a same direction,
   wherein the memory device further comprises a second top electrode and a second mask element, wherein the first top electrode is arranged over the first mask element and the second top electrode is arranged over the second mask element, and the switching layer extends between the first mask element and the second mask element.

4. The memory device of claim 3, wherein the switching layer extends between the first top electrode and the first bottom electrode along both the first side surface and a second side surface opposite to the first side surface of the first mask element.

5. The memory device of claim 3, wherein the switching layer extends between the second top electrode and the first bottom electrode along both a first side surface and a second side surface opposite to the first side surface of the second mask element.

6. The memory device of claim 3, wherein the memory device further comprises a second bottom electrode, and the second mask element is arranged over at least a part of the second bottom electrode.

7. The memory device of claim 6, wherein the memory device further comprises a third bottom electrode and a fourth bottom electrode, and wherein the switching layer extends between the first mask element and the second mask element over the third bottom electrode and fourth bottom electrode.

8. The memory device of claim 7, wherein the switching layer further extends between the first top electrode and the third bottom electrode along a second side surface opposite to the first side surface of the first mask element.

9. The memory device of claim 7, wherein the switching layer further extends between the second top electrode and the fourth bottom electrode along a first side surface of the second mask element and between the second top electrode and the second bottom electrode along a second side surface opposite to the first side surface of the second mask element.

10. The memory device of claim 1, wherein the first side surface of the first top electrode and the first side surface of the first mask element are in vertical alignment with each other.

11. The memory device of claim 1, wherein the switching layer further extends at least partially over each of one or more top electrodes.

12. The memory device of claim 1, further comprising one or more connectors, wherein each connector is arranged through the switching layer to contact a respective one of the one or more top electrodes.

13. The memory device of claim 1, wherein a thickness of the switching layer is less than 15 nm.

14. The memory device of claim 1, wherein a thickness of each of the one or more mask elements is less than 10 nm.

15. The memory device of claim 3, comprising a plurality of the memory devices.

16. A method comprising:
forming a first bottom electrode;
forming a first mask element over a first part of the first bottom electrode;
forming a first top electrode over the first mask element, wherein the first top electrode is in contact with the first mask element;
forming a switching layer over a second part of the first bottom electrode, and along a first side surface of the first mask element and further along a first side surface of the first top electrode, wherein the first side surfaces of the first mask element and the first top electrode face a same direction;
forming a mask layer over the first bottom electrode;
forming an electrode layer over the mask layer; and
etching the mask layer and the electrode layer to form the first top electrode, a second top electrode, the first mask element and a second mask element.

17. The memory device of claim 1, wherein when the memory device comprises the second top electrode, the memory device further comprises a second bottom electrode, and wherein the switching layer extends between the second top electrode and the second bottom electrode along a second side surface opposite to the first side surface of the first mask element.

* * * * *